United States Patent [19]
Jeng

[11] Patent Number: 6,054,769
[45] Date of Patent: Apr. 25, 2000

[54] LOW CAPACITANCE INTERCONNECT STRUCTURES IN INTEGRATED CIRCUITS HAVING AN ADHESION AND PROTECTIVE OVERLAYER FOR LOW DIELECTRIC MATERIALS

[75] Inventor: Shin-Puu Jeng, Plano, Tex.

[73] Assignee: Texas Instruments Incorporated, Dallas, Tex.

[21] Appl. No.: 08/785,618

[22] Filed: Jan. 17, 1997

[51] Int. Cl.[7] .................................................. H01L 23/485
[52] U.S. Cl. .......................... 257/758; 257/748; 257/759; 257/760
[58] Field of Search ........................... 257/730, 748–760, 257/773

[56] References Cited

U.S. PATENT DOCUMENTS

| | | | |
|---|---|---|---|
| 4,843,034 | 6/1989 | Hermdpm et al. | 437/189 |
| 4,851,362 | 7/1989 | Suzuki | 437/31 |
| 4,879,258 | 11/1989 | Fisher | 437/225 |
| 4,986,878 | 1/1991 | Malazgirt et al. | 156/643 |
| 5,073,814 | 12/1991 | Cole, Jr. et al. | 357/54 |
| 5,155,576 | 10/1992 | Mizushima | 357/71 |

(List continued on next page.)

FOREIGN PATENT DOCUMENTS

| | | |
|---|---|---|
| 88-133920/20 | 11/1986 | European Pat. Off. . |
| 89-271922/38 | 3/1988 | European Pat. Off. . |
| 0411795A1 | 7/1990 | European Pat. Off. . |
| 0411795B1 | 7/1990 | European Pat. Off. . |
| 0420405A2 | 8/1990 | European Pat. Off. . |
| 0660409A1 | 12/1994 | European Pat. Off. . |
| 0333132A2 | 3/1989 | Germany . |
| 0476625A2 | 9/1991 | Germany . |
| 59-66171 | 4/1984 | Japan . |
| 60-143619 | 7/1985 | Japan . |
| 62-268144 | 11/1987 | Japan . |
| 63-179548 | 7/1988 | Japan . |
| 3-203240 | 3/1991 | Japan . |
| 5-267290 | 5/1993 | Japan . |

OTHER PUBLICATIONS

V.Grewal, et al. "A Novel Multilevel Metallization Technique for Advanced CMOS and Bipolar Integrated Circuits", V–MIC Conf. Jun. 9–10, 1986 pp. 107–113.

Shin–Puu Jeng, et al. "A Planarized Multilevel Interconnect Scheme With Embedded Low–Dielectric–Constant Polymers for Sub–Quarter–Micro Applications", 1994 Symposium on VLSI Technology Digest of Technical Papers, pp. 73–74.

Joel r. Wiesner, "Gap Filling of Multilevel Metal Interconnects with 0.25–um Geometries", Oct. 1993, Solid State Technology, pp. 63–64.

IBMTDB, Multilevel Interconnect Structure, vol. 34, No. 9, Feb. 1992, p. 220.

M. A. Hartney, et al. "Oxygen Plasma Etching for Resist Stripping and Multilayer Lithography", J. Vac. Sci. Technol. B. vol. 7, No. 1, Jan./Feb. 1989, pp. 1–11.

Gretchen M. Adema, et al. "Passivation Schemes for Copper/Polymer Thin Film Interconnections Used in Multichip Modules", 1992 IEEE, pp. 776–782.

*Primary Examiner*—Fetsum Abraham
*Attorney, Agent, or Firm*—Bret J. Petersen; Richard L. Donaldson

[57] ABSTRACT

In accordance with the present invention, an improved method and structure is provided for integrating polymer and other low dielectric constant materials, which may have undesirable properties, into integrated circuit structures and processes, especially those requiring multiple levels of interconnect lines. Since the bond is typically weak between low-k materials such as polymers 18 and traditional dielectrics such as $SiO_2$ 22, the weak bonding may cause delamination or other problems during subsequent processing. The present invention increases yield and simplifies processing subsequent to application of the low-k material by providing an adhesion/protective layer 20 between the low-k material 18 and the intermetal dielectric 22. A preferred embodiment is a spun-on layer 20 of HSQ cured on a hotplate prior to application of the $SiO_2$ intermetal dielectric.

16 Claims, 3 Drawing Sheets

U.S. PATENT DOCUMENTS

| | | | |
|---|---|---|---|
| 5,231,043 | 7/1993 | Chan et al. | 437/52 |
| 5,233,224 | 8/1993 | Ikeda et al. | 257/773 |
| 5,302,233 | 4/1994 | Kim et al. | 156/636 |
| 5,310,700 | 5/1994 | Lien et al. | 437/195 |
| 5,336,368 | 8/1994 | Iacovangelo et al. | 156/656 |
| 5,352,493 | 10/1994 | Dorfman et al. | 427/530 |
| 5,356,513 | 10/1994 | Burke et al. | 156/636 |
| 5,366,850 | 11/1994 | Chen et al. | 430/314 |
| 5,376,591 | 12/1994 | Maeda et al. | 437/238 |
| 5,391,921 | 2/1995 | Kudoh et al. | 257/758 |
| 5,407,860 | 4/1995 | Stoltz et al. | 437/180 |
| 5,413,962 | 5/1995 | Lur et al. | 437/195 |
| 5,461,003 | 10/1995 | Havemann et al. | 437/187 |
| 5,486,493 | 1/1996 | Jeng | 437/195 |
| 5,512,775 | 4/1996 | Cho | 257/522 |
| 5,789,819 | 8/1998 | Gnade et al. | 257/759 |
| 5,818,111 | 10/1998 | Jeng et al. | 257/748 | ps
LOW CAPACITANCE INTERCONNECT STRUCTURES IN INTEGRATED CIRCUITS HAVING AN ADHESION AND PROTECTIVE OVERLAYER FOR LOW DIELECTRIC MATERIALS

CROSS-REFERENCES TO RELATED APPLICATIONS

The following co-assigned previously filed applications are related to the instant application and are incorporated herein by reference.

| Application | TI Case | Filing Date | Title |
| --- | --- | --- | --- |
| S/N 08/137,658 | TI-18509 | 10/15/93 | Planarized Structure for Line-Line Capacitance Reduction |
| S/N 08/298,807 | TI-19532 | 08/03/94 | Improving Interconnect Capacitance Between Metal Leads |
| S/N 08/455,765 | TI-18929AA | 05/31/95 | A Planarized Multi-Level Interconnect Scheme With Embedded Low-Dielectric Constant Insulators |
| S/N 60/005132 | TI-20784 | 10/12/95 | A Low Capacitance Interconnect Structure For Integrated Circuits |
| S/N 60/007,053 | TI-20907 | 10/25/95 | Highly Thermally Conductive Interconnect Structure |
| S/N 60/ | TI-21909 | 12/04/95 | A Low Capacitance Interconnect Structure For Integrated Circuits Using Decomposed Polymers |

FIELD OF THE INVENTION

This invention generally relates to structures for reducing capacitance between closely spaced interconnect lines of integrated circuits. More particularly, it relates to a method of improving adhesion between low dielectric constant materials and traditional intermetal dielectric materials and protecting the low dielectric material from subsequent processes.

BACKGROUND OF THE INVENTION

Integrated circuits have continued to shrink in size and increase in complexity with each new generation of devices. As a result, integrated circuits increasingly require very close spacing of interconnect lines and many now require multiple levels of metalization, as many as five, to interconnect the various circuits on the device. Since closer spacing increases capacitance between adjacent lines, as the device geometries shrink and densities increase capacitance and cross talk between adjacent lines becomes more of a problem. Therefore, it becomes increasingly more desirable to use lower dielectric materials to offset this trend and thereby lower capacitance between closely spaced interconnects.

Interconnect capacitance has two components: the line-to-substrate, or line-to-ground capacitance and line-line capacitance. For ultra large scale integration at 0.25 micron design rules and beyond, performance is dominated by interconnect RC delay, with line-to-line capacitance being the dominant contributor to total capacitance. For example, theoretical modeling has shown that when the width/spacing is scaled down below 0.3 micron, the interlayer capacitance is so small that total capacitance is dictated by the line-to-line capacitance, which constitutes more than 90% of the total interconnect capacitance. Therefore, a reduction of the line-line capacitance alone will provide a dramatic reduction in total capacitance.

The intermetal dielectric (IMD) of the prior art is typically $SiO_2$ which has a dielectric constant of about 4.0. It would be desirable to replace this material with a material having a lower dielectric constant. As used herein, low dielectric constant or low-k means a material having a dielectric constant of lower than 4 and preferably lower than 3 and most preferably about 2 or lower. Unfortunately, materials having a lower dielectric constant have characteristics that make them difficult to integrate into existing integrated circuit structures and processes. Many polymeric materials such as polysilsequioxane, parylene, polyimide, benzocyclobutene and amorphous Teflon have lower dielectric constants (lower permitivities). Compared to $SiO_2$, these low-k materials may have low mechanical strength, poor dimensional stability, poor temperature stability, high moisture absorption and permeation, poor adhesion, large thermal expansion coefficient and/or an unstable stress level. Because of these attributes, the use of polymer or other low dielectric materials as a stand alone replacement for $SiO_2$ in integrated circuit processes or structures is very difficult if not impossible.

An earlier application, by Havemann, SN 08/250,142 assigned to Texas Instruments Inc. and incorporated herein by reference, disclosed a two-step metal etch process for selectively filling the gaps of narrowly spaced interconnects to reduce capacitance in VLSI circuits while using a structurally sturdy interlevel dielectric in non-critical areas.

Another application by applicant herein, SN 08/202,057, assigned to Texas Instruments Inc. and incorporated herein by reference, disclosed a method for filling narrow gaps with low dielectric constant materials.

SUMMARY OF THE INVENTION

In accordance with the present invention, an improved method and structure is provided for integrating polymer and other low dielectric constant materials, which may have undesirable properties such as those discussed above, into integrated circuit structures and processes, especially those requiring multiple levels of interconnect lines. Since the bond is typically weak between low-k materials such as polymers and traditional dielectrics such as $SiO_2$, the weak bonding may cause delamination or other problems during subsequent processing. The present invention increases yield and simplifies processing subsequent to application of the low-k material by providing an adhesion layer between the low-k material and the intermetal dielectric. This layer also serves to protect the low-k material from highly oxidizing environments such as plasma CVD $SiO_2$ deposition.

The present invention also facilitates combining the advantages of traditional intermetal dielectrics such as $SiO_2$ and low dielectric constant materials. In preferred embodiments, the present invention is combined with the methods of the above referenced applications. These applications include methods to selectively place the low-k material in critical areas of the device where low-k materials are needed. Since the interlayer dielectric is still mostly comprised of a traditional dielectrics many of the problems discussed above are alleviated. Structural stability, adhesion, thermal conductivity etc. are provided by the $SiO_2$ or other suitable dielectric.

In a preferred embodiment, interconnect lines are first patterned and etched. A low-k material is spun across the surface of the wafer to fill areas between interconnect lines. The critical areas, those narrowly spaced interconnects where the low-k material is to remain, are masked off with resist. The low-k material in non-critical and/or widely spaced areas is then etched away, leaving the possibly problematic but desirable low-k material in those areas where needed. Hydrogen silsesquioxane (HSQ) is spun on to the surface of the low-k material and heated on a hot plate to cure. The chemical formula of HSQ as used in this preferred embodiment is $(HSiO_{1.5})_{2n}$, where $n \geq 3$. The cured HSQ film is substantially free of organic components. An intermetal dielectric layer such as $SiO_2$ can then be applied to fill the remaining areas and provide spacing between metal layers. After planarization, the process steps can be repeated for multiple interconnect layers.

An advantage for an embodiment of this invention is the low-k material such as polymers can be used with traditional intermetal dielectrics without failure of the bonding between those intermetal dielectrics and the low-k polymer materials.

An additional advantage for an embodiment of this invention is the inorganic adhesion layer protects low-k polymers under highly oxidizing environments such as plasma CVD $SiO_2$ deposition.

Another advantage of an embodiment of this invention is that the low dielectric constant of HSQ reduces the line-to-ground capacitance.

An additional advantage of this invention is standard metal etching processes can be used and precise etching techniques may not be needed.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
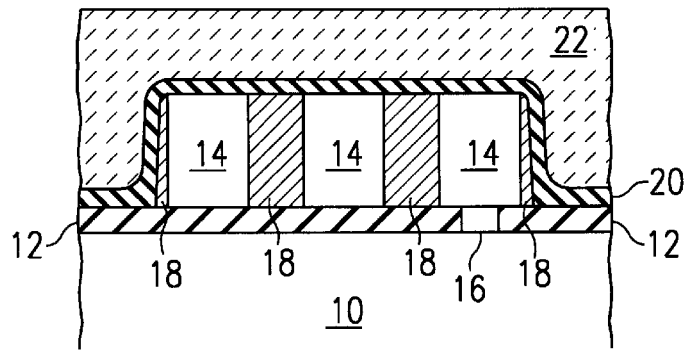
FIG. 1 Represents a cross-sectional view of a preferred embodiment of the present invention.

The preferred embodiments of the present invention are best understood by referring to FIGS. 1–3 of the drawings, like numerals are used for like and corresponding parts of the various drawings.

With reference to FIG. 1, there is shown an embodiment of the present invention, wherein a low-k material 18 is deposited between interconnect lines 14 on a semiconductor substrate 10. The low-k material may be applied by one of several methods known in the art and by those listed in the above referenced applications. An adhesion/protection layer 20 covers the low-k material to provide a good interface to the intermetal dielectric. Above the adhesion layer 20 is a planarized interlayer dielectric. The structure may then be repeated for multi-level interconnects.

Figure 2A:
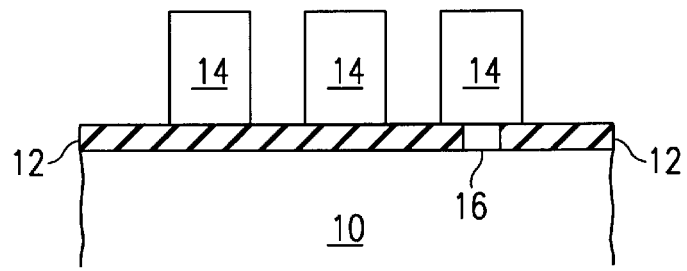
FIG. 2a–e Shows the steps to fabricate the preferred embodiment of FIG. 1.

With reference to FIGS. 2a–2e, there is shown a sequence of steps for forming an embodiment of the present invention which is represented by the completed structure shown in FIG. 1. FIG. 2a illustrates a semiconductor substrate 10 covered with a layer of dielectric 12. The illustrated embodiment of the present invention is directed to reducing capacitance between interconnections on an integrated circuit. Since these interconnections are typically located over the top of active devices fabricated on the surface of a wafer of semiconducting material such as silicon crystal, semiconductor substrate 10 will normally include several layers of various semiconductor materials which make up the active components of the semiconductor device. For simplicity, these layers and devices are not shown in the illustrations. Dielectric layer 12 may be any material suitable for insulating metal interconnect lines 14 from components or other materials in layers below and shown lumped together as semiconductor substrate 10.

Interconnect lines are preferably formed by depositing a layer of aluminum on a preferably planer dielectric layer 12. The aluminum may be masked with a resist, patterned and etched with one of several methods known in the art. This procedure results in the metal connecting lines 14 as shown in FIG. 2a. The method of the present invention contemplates using high aspect ratio metal, where the thickness of the interconnect metal is greater than the width. The high aspect ratio interconnects are useful to reduce line resistance while maintaining close spacing for high density circuits. Connection between the interconnects and the circuits below is represented by the via and plug 16. The number and location of vias is determined by the underlying circuit design.

Figure 2B:
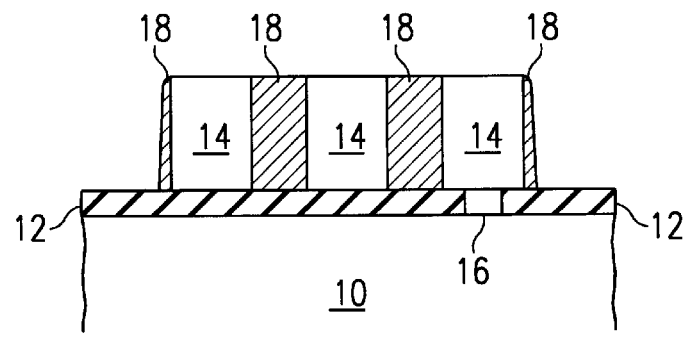
Figure 2C:
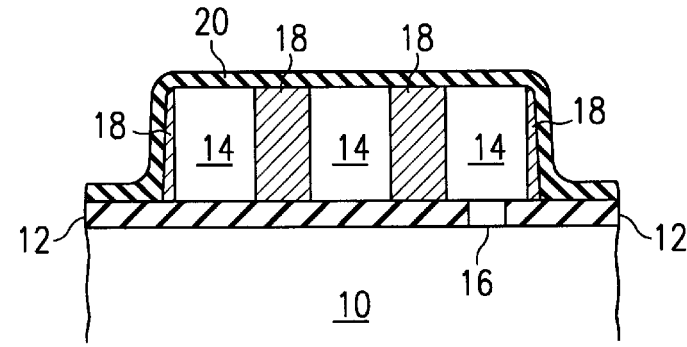

FIG. 2b shows a low dielectric constant polymer material 18 applied between the interconnects 14 on the surface of the wafer. The polymer material 18 is applied in sufficient thickness to fill critical areas between the metal interconnects 14, shown in FIG. 2b. In a preferred embodiment, the low-k material is applied by vapor deposition and then etched back to result in the structure shown in FIG. 2b, which may include some remaining low-k material 18 on the sides of the metal interconnect in non-critical areas as shown. The vapor deposition of polymers and subsequent etch back is disclosed in Ser. No. 08/455,765 (TI-18929AA) by applicant herein. The preferred materials are those listed in the table below, which have a dielectric constant of less than about 3, while the most preferred are polymer materials such as parylene and fluoropolymers.

After application of the polymer material 18, the polymer material is preferably caped with an adhesion layer 20 to prevent or reduce the delamination of the intermetal dielectric, typically plasma $SiO_2$ (PETEOS), from the low-k polymer. The adhesion layer also serves to protect the low-k polymer material from the harsh plasma CVD $SiO_2$ deposition environment. The adhesion layer is preferably hydrogen silsesquioxane (HSQ). Since the HSQ is an inorganic dielectric, use of HSQ does not have the "via poisoning" problems associated with prior art structures such as those using organic spin-on-glass (SOG). The present invention is also preferable to prior art adhesion protection layers using organic silane, since silane is generally intolerant and decomposes in the high temperature CVD process and is sometimes difficult to apply in thin monolayers with the proper density and geometry (having the molecules properly aligned at the bonding surface).

The adhesion layer, preferably HSQ, is preferably applied by spin-on coating about 200–3000 Å in thickness. HSQ can be cured by heating on a hot plate to a low temperature of 300° C. for about 10 minutes. Alternatively, HSQ may be applied by evaporating HSQ molecules onto the surface of the substrate. A PETEOS layer applied over metalization and a polymer dielectric using an adhesion layer made from HSQ has been observed to remain intact while being heated to 450° C. in N$_2$ for 30 minutes. The adhesion/protection layer 20 could also comprise CVD SiO$_2$ deposited at a low temperature to protect the low-k material. While this low temperature SiO$_2$ will not provide as much adhesion as HSQ, it does provide good protection to the low-k material.

Figure 2D:
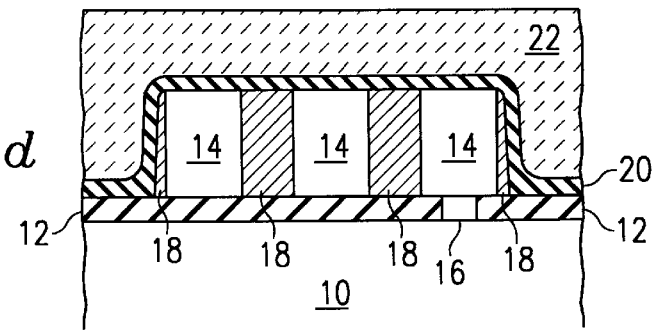

The adhesion layer is preferably followed by a thick, about 10,000–20,000 Å, SiO$_2$ interlayer dielectric for planarization. After planarization of the interlayer dielectric, the structure is as shown in FIG. 2d. In a preferred embodiment, the interlayer dielectric is SiO$_2$ deposited by plasma enhanced chemical vapor deposition (PECVD) and planarized by chemical mechanical polishing (CMP). As further discussed below, the present invention combines the advantages of SiO$_2$ and low dielectric constant materials by placing the low dielectric material only between tightly spaced lines or critical areas. Since the interlayer dielectric is still mostly comprised of a traditional dielectric such as SiO$_2$, many of the problems discussed above are alleviated. Structural stability, adhesion, thermal conductivity etc. are provided by the SiO$_2$ or other suitable dielectric.

Figure 2E:
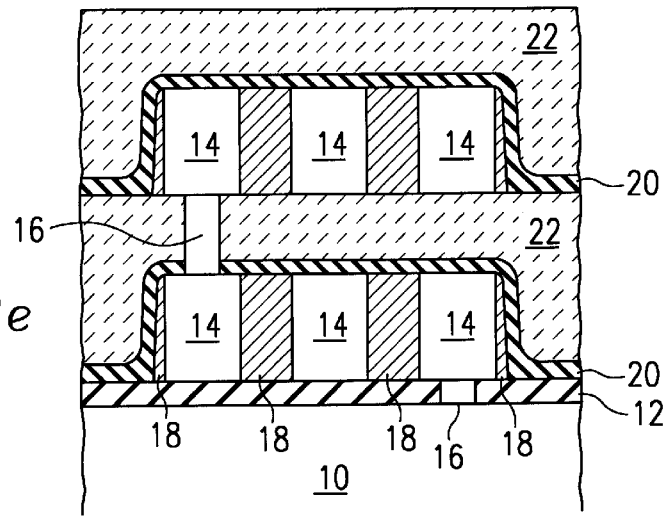

The method of the present invention may be repeated to form multiple levels of interconnects stacked one upon the other. An example of multiple levels is shown in FIG. 2e. Typically multiple level interconnects will necessitate vias 16 and contacts from one level to the next. These vias are usually made after the interlevel dielectric has been applied and planarized in a manner well known in the art.

Figure 3A:
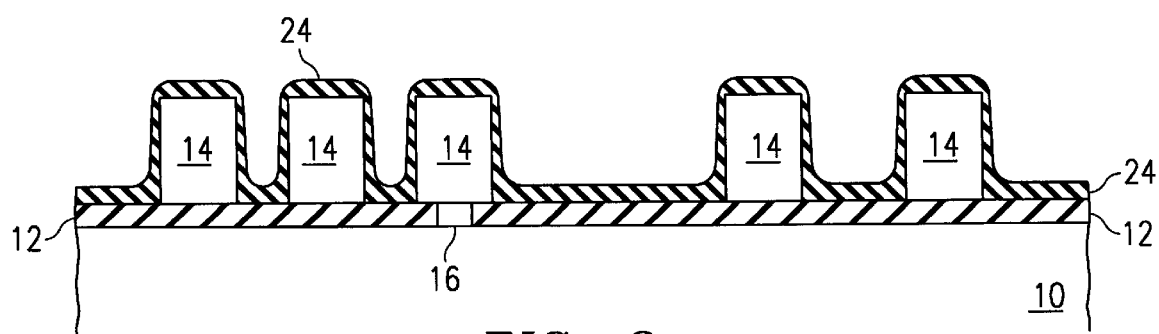
FIG. 3a–e Represents a cross-sectional view of another preferred embodiment of the present invention.
Figure 3B:
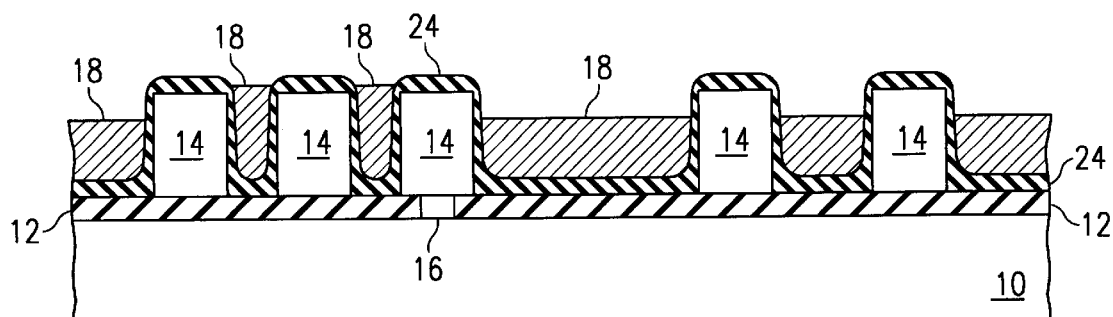
Figure 3C:
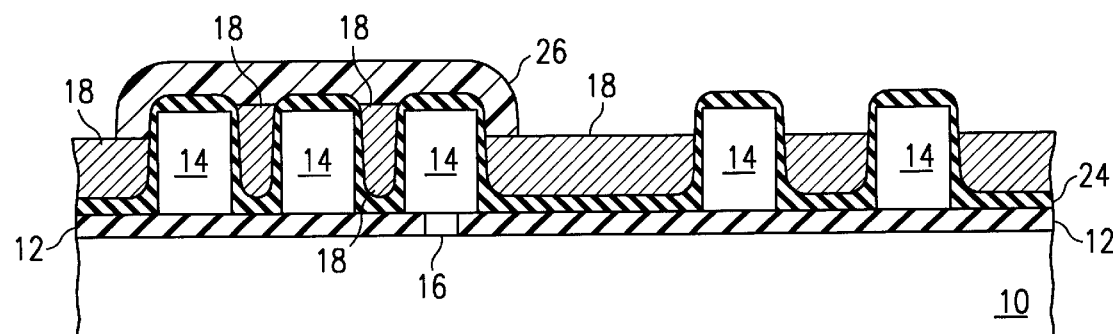
Figure 3D:
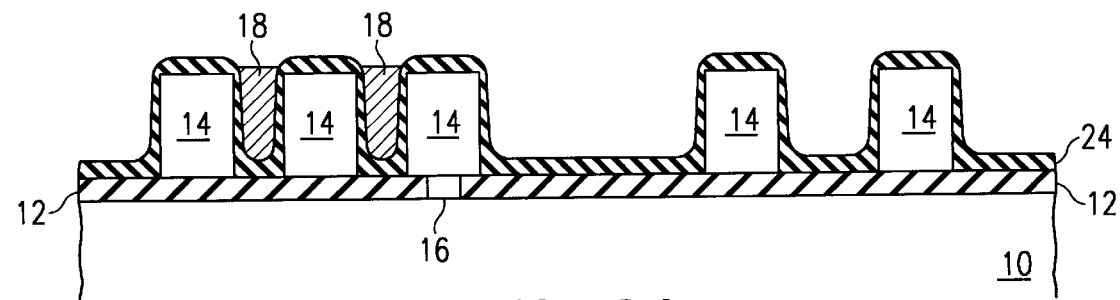
Figure 3E:
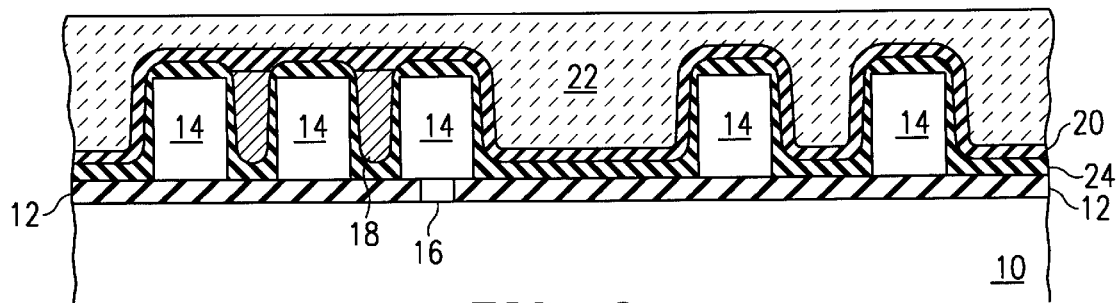

The present invention also contemplates using an adhesion layer in combination with the structures and techniques disclosed in the previous co-assigned applications listed above. In particular, Ser. No. 60/005132 (TI20784) by applicant herein, disclosed a structure for applying low-k materials in selected critical areas while non-critical or widely spaced areas are filled with a conventional dielectric to give mechanical and thermal stability, adhesion, etc. As used herein, "critical areas" are those areas where capacitance is a problem, e.g. where it is desirable to decrease the capacitance between two adjacent metal leads or interconnects. Capacitance is typically a problem where a combination of close spacing of interconnect lines and the relative high frequency of signals on those interconnect lines lead to crosstalk, signal degradation or increased driver requirements. Thus, at low frequencies a minimum lead spacing, which is the minimum spacing allowed by the process design rules, may not be critical; but at higher frequencies that same spacing becomes critical since the interconnect RC delay time becomes the limiting factor for device performance. Critical areas are therefore dependant on design consideration such as frequency of the signals, minimum design rules, tolerance to capacitance etc. Non-critical areas need not be filled, and preferably are not filled with low-k material. FIG. 3d, further discussed below represents a preferred embodiment after the low-k material 18 is etched from the non-critical areas and the resist 26 has been removed. Etching of the low-k material can be done with either dry or wet etch processes known in the art.

In another preferred embodiment, the low-k material is applied by the spin-on method. In the spin-on method the low-k polymer material is dropped in a liquid form onto the spinning wafer (substrate) and the material disperses across the wafer. In this embodiment of the present invention, the methods of Ser. No. 60/005132 (TI-20784) may be used to place the low-k polymer material between closely spaced interconnects in critical areas. FIG. 3a–e illustrates the steps of this method and structure. FIG. 3a shows a substrate 10 having interconnects formed thereon as discussed above for the previous embodiment. FIG. 3a also shows a liner layer 24. The use of a liner layer 24 is optional depending upon whether the low-k dielectric can be directly applied on the interconnects 14. The liner layer may be an etch stopping layer such as a low-dielectric organic spin-on-glass or silicon oxide. The use of the liner layer with reduced sidewall coverage can also improve the process margin for etchback as discussed in TI 19532. A low-k polymer film is then spun onto the surface of the wafer. Spin-on application typically results in the material being deposited with a varying thickness across the wafer. The thickness of the material usually will be thicker in areas where the width of the gap is narrow as shown in FIG. 3b. The preferred materials are those listed in the table below, which have a dielectric constant of less than about 3, while the most preferred materials are fluoropolymers. Critical areas are then masked 26 as shown in FIG. 3c, and the low-k material in non-critical areas is preferable etched away as shown in FIG. 3d. The adhesion layer 20 may then be applied as discussed above and shown in FIG. 3e. An interdielectric 22 is then preferably applied and planarized as discussed above and shown in FIG. 3e.

The sole Table, below, provides an overview of some embodiments and the drawings.

TABLE

| Drawing Element | Preferred or Specific Examples | Generic Term | Other Alternate Examples |
| --- | --- | --- | --- |
| 10 | Silicon Substrate | Substrate or Wafer | GaAs |
| 12 | Silicon Oxide | Buffer Layer | |
| 14 | Aluminum | Interconnect Line | TiN/Al/TiN, Cu |
| 16 | Tungsten | Via | Aluminum |
| 18 | Polymer | Low Dielectric Constant Material | Parylene-C, Parylene-N, Parylene co-polymers, Teflon, Polyimide, Fluorinated Polyimide, Benzocyclobutene, Fluorinated benzo-cyclobutene, Organic SOG. |
| 20 | HSQ | Adhesion Layer | Low Temperature SiO$_2$ |
| 22 | SiO$_2$ | Inter-metal Dielectric | Fluorinated SiO$_2$, Diamond, or other dielectrics with good mechanical strength. |
| 24 | Silicon Oxide | Liner | |
| 26 | Photoresist | Mask | |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microelectronic device structure comprising:
   (a) a substrate;
   (b) interconnects formed on said substrate wherein at least two of said interconnects are located in a critical area,
   (c) a low-dielectric material between at least two of said interconnects in said critical area;
   (d) an adhesion/protective layer of HSQ on said low-dielectric material; and
   (e) a structural dielectric layer formed of a second dielectric material over said adhesion layer on said low dielectric material between said interconnects in said critical area and over said substrate in areas not having interconnects and in any non-critical areas not having low-dielectric material.

2. The microelectronic structure of claim 1, wherein said low-dielectric material provides a dielectric constant of less than 3 in a region between at least two of said interconnects.

3. The microelectronic structure of claim 1, wherein said structural dielectric layer comprises multiple layers of dielectric materials.

4. The microelectronic structure of claim 1, wherein said structural layer is planarized and further comprising one or more additional levels of interconnects above said interconnect lines.

5. A microelectronic device structure comprising:
   (a) a substrate;
   (b) interconnects formed on said substrate wherein at least two of said interconnects are closely spaced, wherein closely spaced means having a spacing of less than or equal to one and one-half a minimum spacing;
   (c) a low-dielectric material between at least two of said interconnects which are closely spaced;
   (d) an adhesion/protective layer of HSQ on said low-dielectric material; and
   (e) a structural dielectric layer formed of a second dielectric material over said adhesion layer on said low dielectric material between said closely-spaced interconnects.

6. The microelectronic structure of claim 5, wherein said low-dielectric material provides a dielectric constant of less than 3 in a region between at least two of said interconnects.

7. The microelectronic structure of claim 5, also comprising a liner layer over said conductive interconnect lines and below said low dielectric constant material.

8. The microelectronic structure of claim 5, wherein said structural dielectric material is $SiO_2$.

9. The microelectronic structure of claim 5, wherein said structural layer is planarized and further comprising one or more additional levels of interconnects above said interconnect lines.

10. The microelectronic structure of claim 5, wherein said structural dielectric layer comprises multiple layers of dielectric materials.

11. The microelectronic structure of claim 7, wherein said liner layer material is selected from the group consisting of: silicon dioxide, nitrogen doped silicon dioxide, and boron doped silicone dioxide.

12. The microelectronic device of claim 5, wherein said low dielectric constant material is selected from the group consisting of: Polyimide, Polysilsequioxane, Benzocyclobutene, Parylene N, Florinated polyimide, Parylene F, Parylene co-polymers, Poly-naphthalene, Amorphous Telflon, Polymer foams, Aerogel, Xerogel organic SOG.

13. A microelectronic device structure comprising:
   (a) a substrate;
   (b) interconnects formed on said substrate wherein at least two of said interconnects are closely spaced, wherein closely spaced means having a spacing of less than or equal to one and one-half a minimum spacing;
   (c) a low-dielectric material which provides a dielectric constant of less than 3 in a region between at least two of said interconnects which are closely spaced, wherein said low dielectric constant material is selected from the group consisting of: Polyimide, Polysilsequioxane, Benzocyclobutene, Parylene N, Florinated polyimide, Parylene F, Parylene co-polymers, Poly-naphthalene, Amorphous Telflon, Polymer foams, Aerogel, Xerogel organic SOG;
   (d) an adhesion/protective layer of HSQ on said low-dielectric material; and
   (e) a structural dielectric layer formed of a second dielectric material over said adhesion layer on said low dielectric material between said closely-spaced interconnects.

14. The microelectronic structure of claim 13, further comprising a liner layer over said conductive interconnect lines and below said low dielectric constant material.

15. The microelectronic structure of claim 14, wherein said liner layer material is selected from the group consisting of: silicon dioxide, nitrogen doped silicon dioxide, and boron doped silicone dioxide.

16. The microelectronic structure of claim 13, wherein said structural layer is planarized $SiO_2$ and further comprising one or more additional levels of interconnects above said interconnect lines.

* * * * *